United States Patent
Mountain

(10) Patent No.: US 7,351,608 B1
(45) Date of Patent: Apr. 1, 2008

(54) METHOD OF PRECISELY ALIGNING COMPONENTS IN FLEXIBLE INTEGRATED CIRCUIT MODULE

(75) Inventor: David Jerome Mountain, Baltimore, MD (US)

(73) Assignee: The United States of America as represented by the Director of the National Security Agency, Washington, DC (US)

( * ) Notice: Subject to any disclaimer, the term of this patent is extended or adjusted under 35 U.S.C. 154(b) by 540 days.

(21) Appl. No.: 10/923,612

(22) Filed: Aug. 19, 2004

(51) Int. Cl.
*H01L 21/50* (2006.01)

(52) U.S. Cl. .............................. 438/106; 257/E21.499

(58) Field of Classification Search ................ 438/106, 438/107, 108, 110, 118, 125, 455, 458
See application file for complete search history.

(56) References Cited

U.S. PATENT DOCUMENTS

| | | | | |
|---|---|---|---|---|
| 5,499,444 A | * | 3/1996 | Doane et al. ................. | 29/830 |
| 5,998,291 A | * | 12/1999 | Bakhit et al. ................ | 438/618 |
| 6,194,245 B1 | * | 2/2001 | Tayanaka ..................... | 438/57 |
| 6,897,096 B2 | * | 5/2005 | Cobbley et al. ............. | 438/123 |
| 6,964,201 B2 | * | 11/2005 | Xu et al. ...................... | 73/794 |
| 7,018,866 B2 | * | 3/2006 | Sugaya et al. .............. | 438/108 |
| 7,169,652 B2 | * | 1/2007 | Kimura ........................ | 438/149 |

* cited by examiner

*Primary Examiner*—Scott B. Geyer
(74) *Attorney, Agent, or Firm*—Jennifer P. Ferragut

(57) ABSTRACT

The present invention is a method of aligning components on a flexible integrated circuit. First a rigid substrate is selected. Next a flexible interconnect is deposited on the substrate, the interconnect preferably consisting of alternating polyimide and metal layers. After depositing the interconnect on the substrate, solder bumps are applied to the interconnect. Next, attach electronic components to the interconnect. A second substrate is then attached to the electronic components. Then, remove the first substrate to expose the interconnect. Last, the second substrate is removed to release the integrated circuit module.

32 Claims, 1 Drawing Sheet

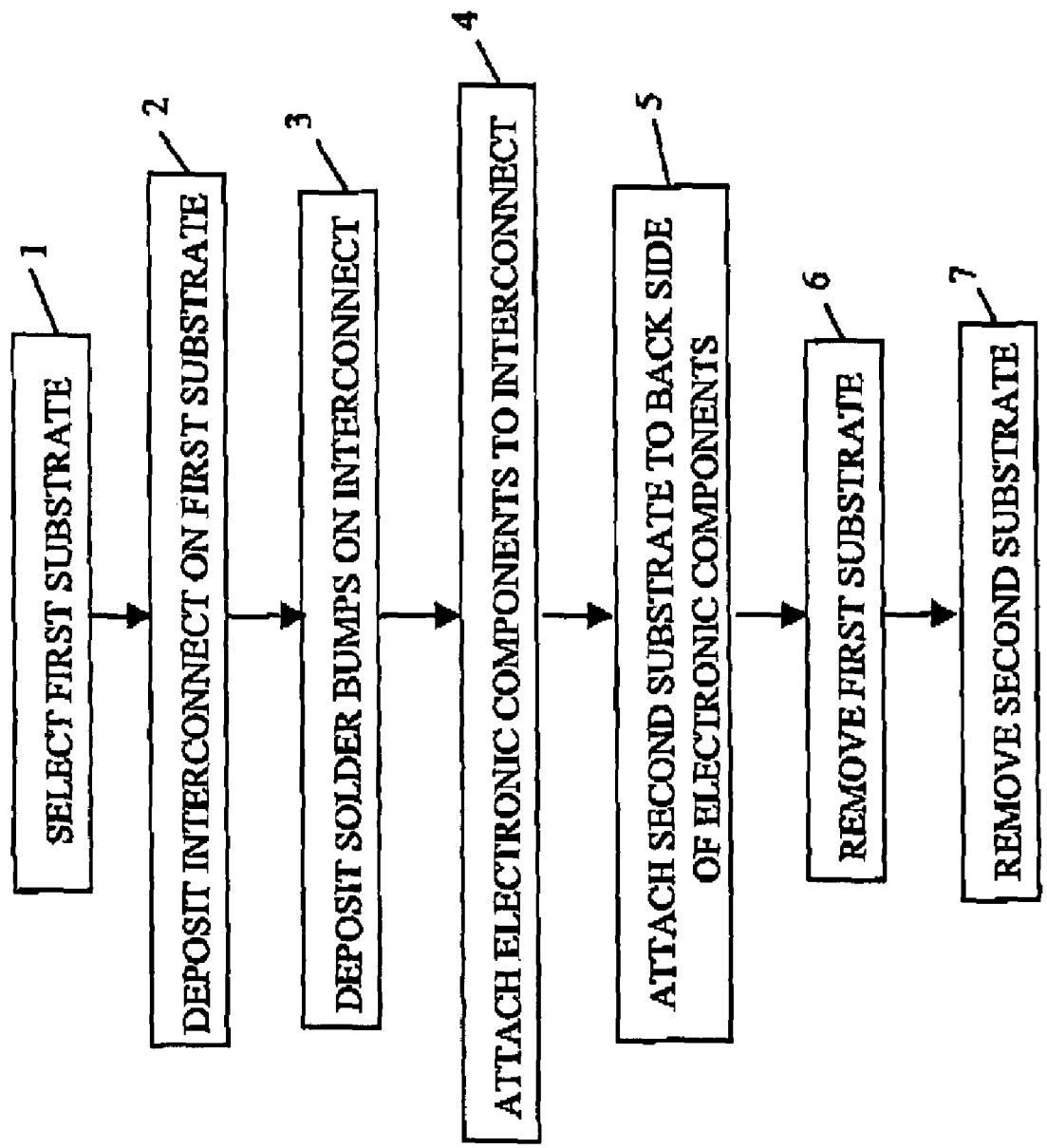

METHOD OF PRECISELY ALIGNING COMPONENTS IN FLEXIBLE INTEGRATED CIRCUIT MODULE

FIELD OF INVENTION

This invention relates to a semiconductor device manufacturing process and, more specifically, to a semiconductor device manufacturing process involving bonding of plural semiconductor substrates and subsequent separation of the substrates.

BACKGROUND OF THE INVENTION

Advancements in technology have led to smaller and more compact microelectronic devices. The result is an increasing need in the microelectronic field for very dense microelectronics systems. To reduce the size of the electronic device, the area required for the integrated circuits comprising the device must also be reduced. Thin film structures were designed to solve this problem. In a thin film structure an interconnect is fabricated on a substrate using alternating layers of insulating and conductive material. Typical interconnects are constructed of polyimide layers and copper layers. Additional electrical components can be attached to the interconnect. By using an extremely thin substrate, the size of the integrated circuit can be decreased even further. This construction is known as a "flex circuit."

"Flip-chip" technology is frequently used to manufacture flex circuits. Flip-chip technology consists of turning the semiconductor integrated circuit, or chip, upside down during processing to connect the integrated circuit to the substrate. In this process the circuit side of the integrated circuit is generally bonded to the substrate using solder. The alignment of the chips to the substrate must be fairly precise during attachment. However, the flexible nature of thin substrates makes it difficult to achieve the necessary precision during attachment and presents a significant problem during fabrication of flex circuits. Prior art methods have attempted to solve the problems associated with integrated circuit alignment through mechanical fixtures or laser drilled holes to assist in alignment. However, these methods require extra tooling at significant expense and also cause damage to the underlying device. Therefore, rigid substrates have been chosen for many applications where a thin substrate would be more desirable.

U.S. Pat. No. 5,998,291, entitled "ATTACHMENT METHOD FOR ASSEMBLY OF HIGH DENSITY MULTIPLE INTERCONNECT STRUCTURES," discloses a method for fabricating a high density multiple interconnect decal using multiple substrates. The flexible interconnect is first secured to a substrates and a protective film is applied to the interconnect. A carrier is secured to the protective film to create a flat surface on the interconnect. The module is then secured to a mounting substrate. The carrier and protective film are thereafter removed, leaving only the interconnect and the mounting substrate. The electrical components are mounted on the interconnect at this point. The present invention does not process semiconductors in this manner. U.S. Pat. No. 5,998,291 is hereby incorporated by reference into the specification of the present invention.

U.S. Pat. No. 6,183,588, entitled "PROCESS FOR TRANSFERRING A THIN-FILM STRUCTURE TO A SUBSTRATE," discloses a method for manufacturing a semiconductor device structure consisting of at least a thin film structure and a metal interconnect. A dielectric layer is deposited on a primary carrier. The metal interconnect is deposited on the dielectric layer and the thin film structure is built on the metal interconnect. A release interface is defined between the dielectric layer and the metal interconnect to facilitate release of the thin film structure and metal interconnect from the primary carrier. In an alternative embodiment, the thin film structure is attached to a permanent substrate prior to release of the primary carrier. The present invention does not use this method to process thin film structures. U.S. Pat No. 6,183,588 is hereby incorporated by reference into the specification of the present invention.

U.S. Pat. No. 6,194,245, entitled "METHOD FOR MAKING THIN FILM SEMICONDUCTORS," discloses a method for epitaxially growing a semiconductor thin film on a semiconductor substrate. The semiconductor substrate includes a porous structure allows the semiconductor thin film to be easily separated from the substrate after fabrication of the semiconductor thin film, which is a preferred embodiment is a flexible thin film. In another preferred embodiment, a transparent substrate is attached to the top surface of the semiconductor thin film prior to separation of the semiconductor thin film from the semiconductor substrate. The present invention does not process semiconductors in this manner. U.S. Pat. No. 6,194,245 is hereby incorporated by reference into the specification of the present invention.

U.S. Pat. No. 5,499,444, entitled "METHOD OF MANUFACTURING A RIGID FLEX PRINTED CIRCUIT BOARD," discloses a method of manufacturing a circuit board from a flex layer using a hot press operation. To achieve this, windows are drilled through the flex layer and each other circuit layer, the windows are aligned, and protrusions from the press are inserted through the windows to align the structures during fabrication of the final product. The present invention does not use this method of circuit fabrication. U.S. Pat. No. 5,499,444 is hereby incorporated by reference into the specification of the present invention.

As can be seen from the prior art, one difficulty with production of a flex circuit is that several support structures must typically be used to create the flex circuit. After creation of the flex circuit, alignment structures are then used to allow electronic devices to be attached to the substrates. These additional alignment structures frequently require alteration of the circuit, add significant additional production expense, and do not provide the precision necessary for the alignment operation. It is therefore desirable in the art to have a method for producing a flex circuit and aligning it with electronic components without the use of multiple external devices.

SUMMARY OF THE INVENTION

It is an object of the invention to fabricate a semiconductor integrated circuit module by attaching electronic components to a flexible interconnect rigidly mounted on a substrate.

It is a further object of the present invention to fabricate a semiconductor integrated circuit module by attaching electronic components to a flexible interconnect rigidly mounted on a substrate and removing the substrate to produce a flex circuit.

The present invention is a method of fabricating a semiconductor integrated circuit module having a flexible interconnect layer and at least one electronic component attached. The first step of the method is selecting a first substrate.

The second step of the method is depositing an interconnect on the first substrate, the interconnect preferably consisting of alternating polyimide and metal layers.

The third step of the method is depositing solder bumps on the interconnect.

The fourth step of the method is attaching electronic components to the interconnect.

The fifth step of the method is attaching a second substrate to the back sides of the electronic components.

The sixth step of the method is removing the first substrate. The first substrate is preferably removed using a destructive process such as wet etching.

The seventh step of the method is removing the second substrate.

BRIEF DESCRIPTION OF THE DRAWINGS

The FIGURE is a flowchart of the processing steps of the present invention.

DETAILED DESCRIPTION OF THE PREFERRED EMBODIMENT

The present invention is a method of fabricating a semiconductor integrated circuit module having a flexible interconnect layer and at least one electronic component. The figure shows the processing steps of the present invention. The first step 1 of the method is selecting a first substrate. The first substrate is composed of a suitable rigid material, many of which are well known and commonly used in the art, but is preferably a silicon wafer. As would be obvious to one of skill in the art, any other suitable substrate material could be used, such as such as quartz, polysilicon, silicon-on-insulator, or gallium arsenide. In a preferred embodiment the substrate has a diameter of approximately 150 mm. Additionally, a special release material may be incorporated into the substrate, preferably in the form of a release layer on the upper surface of the substrate, to facilitate release of materials attached to the substrate.

The second step 2 of the method is depositing an interconnect on the top side of the substrate. An interconnect is a structure that connects elements of an integrated circuit and, in high density integrated circuits, is typically comprised of alternating layers of an insulating material and a metal. The metal typically forms the electrical connections of the integrated circuit. In the preferred embodiment, alternating layers of polyimide and metal (preferably copper) are deposited on the top side of the first substrate to form an interconnect, however any other suitable materials can be used to form the interconnect as would be obvious to one of skill in the art. Any conventional method can be used to apply the interconnect layers to the substrate, many of which are well known and commonly used in the art, such as metal deposition, plating, photolithography, and screen printing. After this step, the interconnect can be tested if desired.

The third step 3 of the method is depositing solder bumps on the interconnect. As is obvious to those of skill in the art, a solder bump is a ball of solder deposited at a precise location on an interconnect and provides the mechanical and electrical connection between the interconnect and circuit board or other electronic component. Solder bumps can be deposited on the interconnect by any conventional method, such as evaporation, electroplating or stencil printing. This step may be eliminated from the process according to user preferences and appropriate integrated circuit design considerations, as would be obvious to one skilled in the art.

The fourth step 4 of the method is attaching electronic components to the interconnect. Any conventional electronic components may be attached to the interconnect, many of which are well known and commonly used in the art, such as integrated circuits, ultra-thin integrated circuits, thin film circuits, resistors, capacitors, inductors, filters and oscillators. In the preferred embodiment multiple electronic components are attached to the interconnect, however as few as one electronic component may be attached to the interconnect. The electronic components may be attached to the interconnect by any conventional method, such as stud bump or solder bump processing, anisotropic conductive films technology and wirebonding. As is obvious to one of skill in the art, if multiple electronic components are attached to the interconnect a combination of attachment methods may be used according to user preferences. If necessary, the electronic components can be underfilled using any of the standard materials available for this purpose, such as filled epoxies. The interconnected components can be tested as a complete module both before and after underfill if desired.

The fifth step 5 of the method is attaching a second substrate to the back side of the electronic components. The second substrate is composed of a suitable material, many of which are well known and commonly used in the art, but is preferably a silicon semiconductor wafer. Alternatively, the second substrate could be a perforated quartz wafer. As would be obvious to one of skill in the art, any other suitable substrate material could be used, such as such as quartz, polysilicon, silicon-on-insulator, or gallium arsenide. In a preferred embodiment the substrate has a diameter of approximately 150 mm. Additionally, a special release material may be incorporated into the substrate, preferably in the form of a release layer on the front surface of the substrate, to facilitate release of materials attached to the substrate. Use of a perforated substrate also aids in the release of devices from the substrate.

The second substrate can be attached to the electronic components by any conventional means, many of which are well known and commonly used in the art, but is preferably connected to the electronic components using an acrylic adhesive. To accomplish this, the front side of the second substrate is coated with the adhesive and the second substrate is placed in contact with the electronic components. The elements are held in contact until the adhesive has bonded the two surfaces together, in the preferred embodiment this takes approximately one minute. This process may be performed manually or in an automated process.

The sixth step 6 of the method is removing the first substrate. Removal of the first substrate may be accomplished by any conventional method, but preferably is achieved using a destructive removal method. In the preferred embodiment the first substrate is removed by wet etching. The first substrate is preferably thinned using a wet etching process until the first polyimide layer of the interconnect is reach. The first polyimide layer will act as a natural etch stop, as would be obvious to those of skill in the art. Alternatively, the first substrate can be removed by immersion of the assembly in an etchant. If this method is used, a seal or protective casing must be placed around the electronic components and interconnect to prevent damage to these elements during removal of the first substrate. To remove a substrate by immersion, the necessary components are sealed and the assembly is immersed in a dump rinse tank filed with a suitable etchant until the adhesive is dissolved, thus separating the first substrate from the interconnect. If special release layers have been used, as discussed in greater detail above, appropriate methods may be used to release the first substrate from the interconnect, such as heat and UV radiation. The method used to separate the first substrate will depend on the material used for the release layer.

The seventh step 7 of the method is removing the second substrate. Removal of the second substrate may be accomplished by any conventional means, but preferably comprises using acetone to dissolve the acrylic adhesive bonding the second substrate to the electronic components. As is obvious to those of skill in the art, if a method other than acrylic adhesive is used to bond the second substrate to the electronic components, an appropriate removal method is used. Such removal methods include application of a solvent, UV irradiation and water soaks. Removal time can be decreased by a variety of methods, including use of a porous substrate, which was discussed in greater detail above, and ultrasonic agitation. Ultrasonic agitation is used when a substrate is immersed in water or a solvent for removal and consists of applying sonic energy to the liquid to enhance removal of particles from the surface of the substrate. In this case, the particles removed would be the acrylic adhesive.

Removal of the second substrate results in release of a completed integrated circuit module. This integrated circuit module includes a flexible substrate, that substrate being the interconnect, and at least one electronic component. By connecting the electronic components to the flexible interconnect while the interconnect was mounted on the rigid first substrate, it was possible to precisely align the electronic components on the interconnect without the use of external alignment aids. This process eliminates the need of special tooling and fixtures previously required for the fabrication of flexible chip modules.

The invention claimed is:

1. A method of precisely aligning components in a flexible integrated circuit module, comprising the steps of:
    a) selecting a first substrate having a front side and a back side;
    b) depositing an interconnect on the front side of the first substrate;
    c) attaching a plurality of electronic components to the interconnect, wherein each of the plurality of electronic components has a front side and a back side, and where the interconnect is connected to the front side of each of the plurality of electronic components;
    d) attaching a second substrate to the back side of each of the plurality of electronic components;
    e) removing the first substrate; and
    f) removing the second substrate.

2. The method of claim 1, wherein the step of depositing an interconnect further includes the steps of:
    a) applying a first polyimide layer to the front side of the first substrate;
    b) applying a metal layer on the first polyimide layer;
    c) applying a second polyimide layer on the metal layer; and
    d) repeating steps (b) and (c) a user-definable number of times.

3. The method of claim 2, wherein the step of attaching a second substrate to the back side of each of the plurality of electronic components further includes the steps of:
    a) applying an adhesive to a first side of the second substrate; and
    b) attaching the first side of the second substrate to the back side of each of the plurality of electronic components.

4. The method of claim 3, wherein the step of applying a metal layer consists of applying and patterning a metal layer on the first polyimide layer.

5. The method of claim 4, wherein the step of applying a second polyimide layer consists of applying and patterning a second polyimide layer on the metal layer.

6. The method of claim 5, further including the step of applying at least one solder bump to the interconnect between the interconnect and the plurality of electronic components.

7. The method of claim 6, wherein the step of selecting a first substrate consists of selecting a first substrate composed of a material chosen from the group of materials consisting of silicon, quartz, porous polysilicon, silicon on insulator, and gallium arsenide.

8. The method of claim 7, wherein the step of attaching a second substrate to the back side of each of the plurality of electronic components consists of attaching a second substrate to the back side of each of the plurality of electronic components, wherein said second substrate is composed of a material chosen from the group of materials consisting of silicon, quartz, porous polysilicon, silicon on insulator, and gallium arsenide.

9. The method of claim 8, wherein the step of applying an adhesive consists of applying an adhesive to a first side of the second substrate, wherein the adhesive is an acrylic adhesive.

10. The method of claim 9, wherein the step of attaching a plurality of electronic components consists of attaching a plurality of electronic components to the interconnect, wherein each of the plurality of electronic components has a front side and a back side, and where the interconnect is connected to the front side of each of the plurality of electronic components, wherein each of the plurality of electronic components is an electronic component chosen from the group of electronic components consisting of integrated circuits, ultra-thin integrated circuits, thin-film circuits, resistors, capacitors, inductors, filters, and oscillators.

11. The method of claim 10, wherein the step of attaching a plurality of electronic components consists of attaching a plurality of electronic components to the interconnect, wherein each of the plurality of electronic components has a front side and a back side, and where the interconnect is connected to the front side of each of the plurality of electronic components, wherein each of said plurality of electronic components is an electronic component chosen from the group of electronic components consisting of integrated circuits, ultra-thin integrated circuits, thin-film circuits, resistors, capacitors, inductors, filters, and oscillators, and wherein the plurality of electronic components are attached to the interconnect by a method chosen from the group of methods consisting of stud bumping, solder bumping, and anisotropic conductive.

12. The method of claim 11, further including the step of depositing an underfill between the plurality of electronic components and the interconnect.

13. The method of claim 12, wherein the step of selecting a first substrate consists of selecting a first substrate that is perforated and that is composed of a material chosen from the group of materials consisting of silicon, quartz, porous polysilicon, silicon on insulator, and gallium arsenide.

14. The method of claim 13, wherein the step of attaching a second substrate to the back side of each of the plurality of electronic components consists of attaching a second substrate to the back side of each of the plurality of electronic components, wherein said second substrate is perforated and is composed of a material chosen from the group of materials consisting of silicon, quartz, porous polysilicon, silicon on insulator, and gallium arsenide.

15. The method of claim 14, wherein the step of removing the second substrate consists of removing the second substrate using acetone.

16. The method of claim 15, wherein the step of removing the second substrate consists of removing the second substrate using acetone and ultrasonic agitation.

17. The method of claim 16, wherein the step of applying a metal layer consists of applying a metal layer on the first polyimide layer, wherein the metal layer is composed of copper.

18. The method of claim 17, further including the step of performing electrical tests on the integrated circuit module completed.

19. The method of claim 1, wherein the step of attaching a second substrate to the back side of each of the plurality of electronic components further includes the steps of:
 a) applying an adhesive to a first side of the second substrate; and
 b) attaching on the first side of the second substrate to the back side of each of the plurality of electronic components.

20. The method of claim 19, wherein the step of applying an adhesive consists of applying an adhesive to a first side of the second substrate, wherein the adhesive is an acrylic adhesive.

21. The method of claim 1, further including the step of applying at least one solder bump to the interconnect between the interconnect and the plurality of electronic components.

22. The method of claim 1, wherein the step of selecting a first substrate consists of selecting a first substrate composed of a material chosen from the group of materials consisting of silicon, quartz, porous polysilicon, silicon on insulator, and gallium arsenide.

23. The method of claim 1, wherein the step of attaching a second substrate to the back side of each of the plurality of electronic components consists of attaching a second substrate to the back side of each of the plurality of electronic components, wherein said second substrate is composed of a material chosen from the group of materials consisting of silicon, quartz, porous polysilicon, silicon on insulator, and gallium arsenide.

24. The method of claim 1, wherein the step of attaching a plurality of electronic components consists of attaching a plurality of electronic components to the interconnect, wherein each of the plurality of electronic components has a front side and a back side, and where the interconnect is connected to the front side of each of the plurality of electronic components, wherein each of the plurality of electronic components is an electronic component chosen from the group of electronic components consisting of integrated circuits, ultra-thin integrated circuits, thin-film circuits, resistors, capacitors, inductors, filters, and oscillators.

25. The method of claim 1, further including the step of depositing an underfill between the plurality of electronic components and the interconnect.

26. The method of claim 1, wherein the step of attaching a plurality of electronic components consists of attaching a plurality of electronic components to the interconnect, wherein each of the plurality of electronic components has a front side and a back side, and where the interconnect is connected to the front side of each of the plurality of electronic components, wherein each of said plurality of electronic components is an electronic component chosen from the group of electronic components consisting of integrated circuits, ultra-thin integrated circuits, thin-film circuits, resistors, capacitors, inductors, filters, and oscillators, and wherein the plurality of electronic components are attached to the interconnect by a method chosen from the group of methods consisting of stud bumping, solder bumping, and anisotropic conductive.

27. The method of claim 1, wherein the step of selecting a first substrate consists of selecting a first substrate that is perforated and that is composed of a material chosen from the group of materials consisting of silicon, quartz, porous polysilicon, silicon on insulator, and gallium arsenide.

28. The method of claim 1, wherein the step of attaching a second substrate to the back side of each of the plurality of electronic components consists of attaching a second substrate to the back side of each of the plurality of electronic components, wherein said second substrate is perforated and is composed of a material chosen from the group of materials consisting of silicon, quartz, porous polysilicon, silicon on insulator, and gallium arsenide.

29. The method of claim 1, wherein the step of removing the second substrate consists of removing the second substrate using acetone.

30. The method of claim 1, wherein the step of removing the second substrate consists of removing the second substrate using acetone and ultrasonic agitation.

31. The method of claim 1, wherein the step of applying a metal layer consists of applying a metal layer on the first polyimide layer, wherein the metal layer is composed of copper.

32. The method of claim 1, further including the step of performing electrical tests of the integrated circuit module completed.

* * * * *